United States Patent [19]

Sullivan

[11] Patent Number: 4,732,829

[45] Date of Patent: * Mar. 22, 1988

[54] POLYMER PRINTING

[76] Inventor: Donald Sullivan, 115 Cambridge Rd., King of Prussia, Pa. 19406

[*] Notice: The portion of the term of this patent subsequent to Mar. 19, 2002 has been disclaimed.

[21] Appl. No.: 672,500

[22] Filed: Nov. 19, 1984

Related U.S. Application Data

[63] Continuation-in-part of Ser. No. 364,309, Apr. 1, 1982, Pat. No. 4,506,004.

[51] Int. Cl.$^4$ ................................................. G03C 3/00
[52] U.S. Cl. ........................................ 430/11; 430/14; 430/19; 430/273; 430/275; 430/312; 430/496; 430/502; 430/523; 430/524; 430/935
[58] Field of Search ................ 430/14, 271, 273, 312, 430/502, 496, 523, 524, 11, 19, 935, 275, 311; 427/282

[56] References Cited

U.S. PATENT DOCUMENTS

| | | | |
|---|---|---|---|
| 3,629,036 | 12/1971 | Isaacson | 156/241 |
| 3,824,104 | 7/1974 | Kloczewski | 430/284 |
| 3,904,492 | 9/1975 | Rich et al. | 204/38 B |
| 4,069,076 | 1/1978 | Fickes | 156/83 |
| 4,260,675 | 4/1981 | Sullivan | 430/315 |
| 4,332,873 | 6/1982 | Hughes et al. | 430/15 |
| 4,376,815 | 3/1983 | Oddi et al. | 430/313 |
| 4,506,004 | 3/1985 | Sullivan | 430/312 |
| 4,528,259 | 7/1985 | Sullivan | 430/312 |
| 4,528,261 | 7/1985 | Hauser | 430/322 |

Primary Examiner—John E. Kittle
Assistant Examiner—José G. Dees
Attorney, Agent, or Firm—Laurence R. Brown

[57] ABSTRACT

Improved printing with polymers is achieved by interposing a liquid layer conforming to rough substrate surfaces and possibly exhibiting different characteristics from an outer surface polymer layer. This is particularly advantageous in printed wiring board (PWB) manufacture requiring solder mask coating. Thus, a two layer composite polymer coating is provided. One inner adhesive photopolymer layer is applied to the PWB in the liquid state, displacing air from PWB surface. The outer layer of the composite therefore can be epoxy, dry film or liquid polymer. Dry film thus carried on a thin plastic sheet may be overlaminated onto a liquid inner layer already on the substrate, without the need for a vacuum laminator to eliminate bubbles or a plasticizing heat step to conform the dry film to the surface. The dry film solder mask so laminated is then exposed through a phototransparency to harden the light struck dry film solder mask and light struck inner layer photopolymer, thereby cojoining the dry film solder mask, inner layer and PWB surface. A solvent washout step removes unexposed dry film solder mask and unexposed inner layer photopolymer. This provides a faster process, requires less equipment, and improves adhesion to metal conductors. This embodiment gives a high resolution product with good solder mask qualities. The outer layer need not be photoimaged. Thus, pre-patterned epoxy solder masks may be printed on the carrier sheet, partially hardened and overlaminated in registor onto liquid photopolymer-coated PWB, then exposed to light source through a phototransparency and through the pre-patterned solder mask, thereby permanently adhering the outer layer to PWB. The composite coating can be a combination of known solder mask materials, dry film, UV-curable liquid polymers and thermalcuring epoxy, chosen for desired characteristics including electrical performance, printing resolution and cost.

11 Claims, 3 Drawing Figures

POLYMER PRINTING

This is a continuation-in-part of my co-pending application Ser. No. 364,309 for Printed Wiring Board, filed Apr. 1, 1982, now U.S. Pat. No. 4,506,004 which was reissued on June 2, 1987 as U.S. Pat. No. Re. 32,430.

TECHNICAL FIELD

This invention relates to printing with liquid polymers and more particularly to registration of patterns on a substrate surface, such as a printed wiring board, by means of an intermediate liquid polymer layer.

BACKGROUND ART

Typically, polymers are used in the manufacture of printed wiring boards (PWB), by coating the PWB with a polymer coating. For solder masks the coating pattern covers conductor wiring traces at all locations except where electrical contact is to be made with the traces. The curing traces may also be printed on a metallic layer such as copper on an insulating substrate by means of polymer printing patterns defining areas which are to be etched in one primary imaging method. In other primary imaging methods, polymer printing patterns may define zones for accumulation of conductive materials forming conductor traces. Other printed objects are similarly manufactured by use of the polymer printing patterns.

In common use are three types of polymers, namely, (1) thermal curing epoxy, (2) ultra-violet (UV)-curing polymers generally classified as liquid polymers which are hardened by radiation, and (3) dry film polymers which are changed in solubility by radiation. The epoxies and UV-curables are applied as liquid coatings for curing in place as contrasted with the dry films.

Some of the patterns formed by these polymers are formed mechanically such as by silk screening. Others are formed by photo-imaging techniques, where the photo response characteristics of certain polymers such as the UV curing liquid polymers are utilized.

Dry film solder mask photopolymers are supplied by two manufacturers, in roll form, consisting of an inner layer of photopolymer sandwiched between a carrier film of clear polyester and a polyolefin liner. They have problems of adhering to copper, and are not conveniently used for overlaying rough surfaces. Thus, for a solder mask coating on a typical PWB, wherein the metal conductors extend 0.003 to 0.004 inch above the base laminate, the dry film needs be conformed without intermediate air bubbles. The use of a roller laminator is not usually satisfactory, as air is trapped between the photopolymer and the PWB laminate, particularly between closely-spaced conductors. A vacuum chamber laminator is normally used in a plasticizing procedure to prevent air entrapment. The lamination cycle is as follows: A PWB and a section of dry film solder mask is inserted into the heated chamber; the chamber is evacuated, and when up to temperature the photopolymer is forced into contact with the PWB, effecting an air-free lamination. Lamination occurs at a temperature of the order of 200 degrees F., at which temperature the dry film solder mask photopolymer becomes tacky and adheres to the PWB surface. The solder mask pattern is attained by exposing the photopolymer to a strong UV light source through a photographic film, wherein the light hardens the exposed photopolymer. The polyester carrier film is then peeled away and the unhardened photopolymer is washed out in a solvent spray bath.

There are several shortcomings with the dry films listed below:

1. The single photopolymer layer is expensive being of the order of four times the cost of liquid photopolymers; the equipment required to laminate is overly complicated and expensive; the labor required is excessive, as each processing step of laminating, exposing, and developing is overly lengthy.

2. The laminating step forces photopolymer into circuit holes, and the like, with the result that with small holes of the order of 0.025 inch diameter, the photopolymer does not wash out, leaving the holes plugged.

3. The laminating step forces photopolymer into large tooling holes and slots, leaving a puckered, striated coating of photopolymer, for the polyester carrier film is non-conforming and wrinkles around larger holes and sharp corners.

4. The dry photopolymer is characterized by a lack of adhesion to metal conductors. For PWB having bare copper conductors with dry film solder mask thereover, the solder coating and hot-air leveling step is usually not satisfactory without copper surface pretreatment as with a black oxide coating; otherwise the solder mask separates from the conductors.

5. The dry photopolymers need be applied in thick layers of standard thicknesses, and the thicker layers are not only expensive but also inhibit high resolution photo reproduction and require higher temperatures to photodevelop.

6. The photopolymer is temperature sensitive, delaying the application sequence. After laminating at 200 degrees F., the photopolymer must cool to room temperature prior to exposure. After exposure, which raises the temperature again, the photopolymer must cool to room temperature before washing out unexposed photopolymer.

Similarly epoxy coatings have disadvantages since the initial liquid layers required need be cured in situ, generally at very high temperatures which can damage the printed wiring boards or other substrates being printed upon.

The liquid polymers provide problems in initial application since they do not tend to stay in place, and have conventionally been applied in very thin coatings, unsuitable for pinhole free coatings, and for covering the rough surfaces of printed wiring traces.

The different polymers each have advantageous features, but it is not known in the prior art how to overcome this disadvantage in producing printed patterns on substrates therewith.

Typical of prior art polymer printing techniques used in PWB are those of U.S. Pat. No. 3,629,036—C. Isaacson, Dec. 21, 1971, where a microthin adhesive layer including a photopolymer solvent is interspersed between smooth copper surfaces and a dry film photoresist layer, which is thereby glued in place before photoimaging and developing the desired pattern.

Reference is made to U.S. Pat. No. 3,824,104 in which Kloczewski teaches a method for photoimaging a liquid photopolymer, wherein the image bearing photomask is separated from the photopolymer by a distance of eight mils during exposure, leading to a stated loss of resolution.

Reference is made to U.S. Pat. No. 4,260,675 in which Sullivan describes a method for photoimaging liquid photopolymer using a glass plate photomask with raised opaque pillars in contact only with portions of the PWB which will be free of hardened solder mask.

Each of these patents and current practices in the art of PWB manufacture has characteristics which this invention seeks to improve.

One objective is to improve the adhesion of dry film to metal conductors.

A second objective is a process to laminate a dry film to a highly irregular surface such as over PWB traces without use of a vacuum laminator.

Another objective is to reduce the time required to process dry film by negating the requirement for laminating at an elevated temperature.

Another objective is to achieve a photoimaged solder mask having the electrical and environmental characteristics of dry film, but at reduced cost.

Another objective is to achieve a photoimaged PWB solder mask in which UV-curable liquids are exposed with a photomask in contact with the liquid, and in which the solder mask coating is not thinned out over the metal conductors.

DISCLOSURE OF THE INVENTION

This disclosure teaches an improved method for polymer printing using a contact layer of a liquid polymer and an outer layer of one of (1) dry film polymer, (2) UV-curable liquid polymer, or (3) dry epoxy polymer.

The combinations of two polymer layers yield a wide range of composite coating characteristics, including electrical performance, environmental reaction, printing placement accuracy, adhesion and cost.

Before the dry film solder mask is applied to the PWB, a coating of liquid photopolymer is screen printed over the entire PWB surface so as to coat both the circuit traces and the base laminate, and in so doing all air is displaced from the PWB surface by the liquid polymer. The dry film solder mask photopolymer is then laminated onto the liquid polymer coated PWB without the need for a vacuum laminator.

In one embodiment, the composite polymer coating is then exposed to a strong UV light source through a photographic film mask, with light struck areas being hardened sufficiently to withstand the subsequent solvent washout step.

When the outer layer is formed from a UV-curable liquid, then the process includes the formation of a semi-cured coating on an image-bearing transparency and the over-lamination of the transparency onto the coated PWB in register. A second exposure step bonds the two layers together and to the PWB. The formation of the semi-cured coating prevents photopolymer thin-out or starvation on the raised metal conductors.

When the outer layer is a dry epoxy polymer that is formed, dried and carried on a thin plastic sheet, then the process is the same as for dry film.

When the outer layer is a non-imaging dry epoxy coating carried on a thin transparent sheet, then the procedure is to apply the coating to the transparent sheet in the liquid state by screen printing the desired image, then curing to a semi-cured state, and then laminating to the coated PWB. When the inner layer is exposed to a light source through the outer coating and through an image bearing transparency, then the inner layer thus exposed bonds the epoxy outer layer thereto. Unexposed inner layer photopolymer is washed out in a solvent and the composite mask completed by a final curing step.

Essential to all these embodiments is the liquid polymer active layer disposed in intermediate surface contact between an outer polymer layer and a substrate surface to be printed, such as a printed wiring board. This liquid layer is disposed in paste like consistency to avoid bubbling and entrapping bubbles and for remaining in situ without running off or into holes, etc. Thus, the objects coated may be handled, and placed vertically, etc. without changing the thickness or placement of the liquid polymer, whether it be patterned, such as from a patterned silk screen deposit on the laminate, or simply forms a constant thickness layer from an unpatterned silk screen deposit, or other desired method.

When the two layers are of different polymers, the inner and outer layers may be provided with differing properties to achieve different objectives with the compound polymer layer, such as better adherance, better heat characteristics, lower cost, better resolution, thinner or thicker coatings, etc. Similarly the layers may be processable with different solvents thereby providing for selective removal of specified layers only, producing a rich range of novel techniques for achieving printed products.

THE DRAWING

PREFERRED EMBODIMENTS

Figure 1:
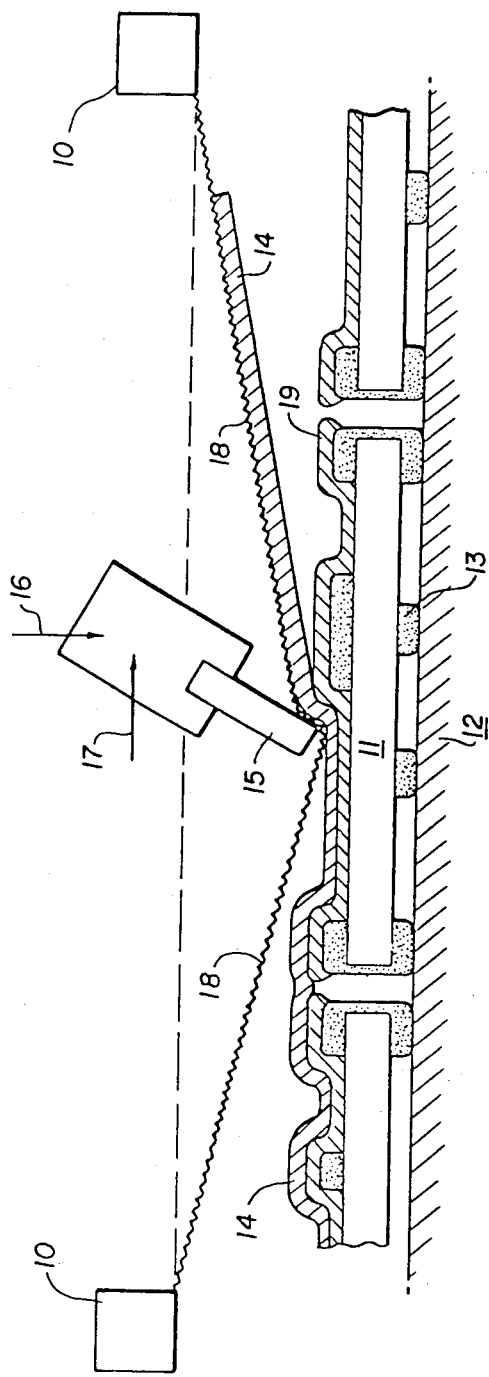
FIG. 1 is a sectional cut-away showing lamination apparatus for coating a printed wiring board with two polymer layers, the inner of which is liquid polymer.

A brief description of the physical and electrical characteristics of various polymer materials is discussed so that the advantage afforded by the disclosed process will be better understood. Table 1 compares the generalized properties of three major types of solder mask materials: screen-printed epoxies, screen-printed UV-curable photopolymers, and dry film solder masks, with the disclosed composite dry film - UV-curable photopolymer solder mask afforded by this invention.

TABLE 1

| Property | Screen Printed Epoxy | Screen Printed UV-Curable Solder Mask | Dry Film Solder Mask | Dry Film Solder Mask Composite With Liquid Inner Layer |
| --- | --- | --- | --- | --- |
| 1. Adhesion | Excellent | Fair | Poor | Excellent |
| 2. Environmental | Excellent | Fair | Excellent | Excellent |
| 3. Electrical | Excellent | Fair | Excellent | Excellent |
| 4. Printing Resolution | Poor | Poor | Excellent | Excellent |
| 5. Material Cost Per Unit Area | 1 | 1.5 | 6 | 4 |
| 6. Application Time | 1.25 | 1 | 5 | 2 |
| 7. Application Equipment | 1 | 4 | 20 | 5 |

TABLE 1-continued

| Property | Screen Printed Epoxy | Screen Printed UV-Curable Solder Mask | Dry Film Solder Mask | Dry Film Solder Mask Composite With Liquid Inner Layer |
|---|---|---|---|---|
| Cost | | | | |
| 8. Total Application Cost | 1 | 1 | 5 | 2 |
| 9. Application Operator Skill Level Required | Highly Skilled | Highly Skilled | Unskilled | Unskilled |

As shown in Table 1, the traditional solder mask epoxies are the best solder mask materials for PWB when the relatively poor printing resolution can be tolerated, whereas the dry film solder mask is outstanding in electrical and environmental characteristics and photo resolution, and requires little operator skill. Dry films, however, are costly and suffer poor adhesion. However, in accordance with this invention, a coating of liquid polymer in paste like consistency is applied over the entire substrate surface prior to dry film application. This results in an air-free lamination effected with relatively inexpensive equipment such as by a scanning squeegee, while the adhesion of the composite is improved over dry film alone. The electrical and environmental characteristics are both excellent, as determined primarily by the dry film outer coating. Material cost is reduced, for instead of a required 3 mil dry film thickness, the composite can be 1 mil of the expensive dry film and 1 mil of inexpensive liquid polymer. A significant further advantage is that photoresolution for photoimaging photopolymers is better for thinner layers, which produce less undercutting during washout.

The main thrust of this invention is a composite coating having a liquid polymer inner layer. A particularly advantageous embodiment provides a two-layer composite in which air sensitive thermal-curing polymers are formed on a thin plastic sheet with one side exposed to air where they become partially-cured through their thickness presenting a liquid layer facing the air side. This liquid side then can cover rough surfaces on a transfer PWB, for example. The outer hardened layer then assures that the outer layer thickness is superimposed over wiring traces to prevent starving.

As used in this disclosure a liquid polymer has a range of viscosities from that of a fluid to heavy paste-consistency; viscosities normally encountered in liquids used in screen printing, roller coating, and curtain coating.

EXAMPLE 1

Dry Film Photopolymer Covering Liquid Photopolymer Inner Layer

Figure 2:
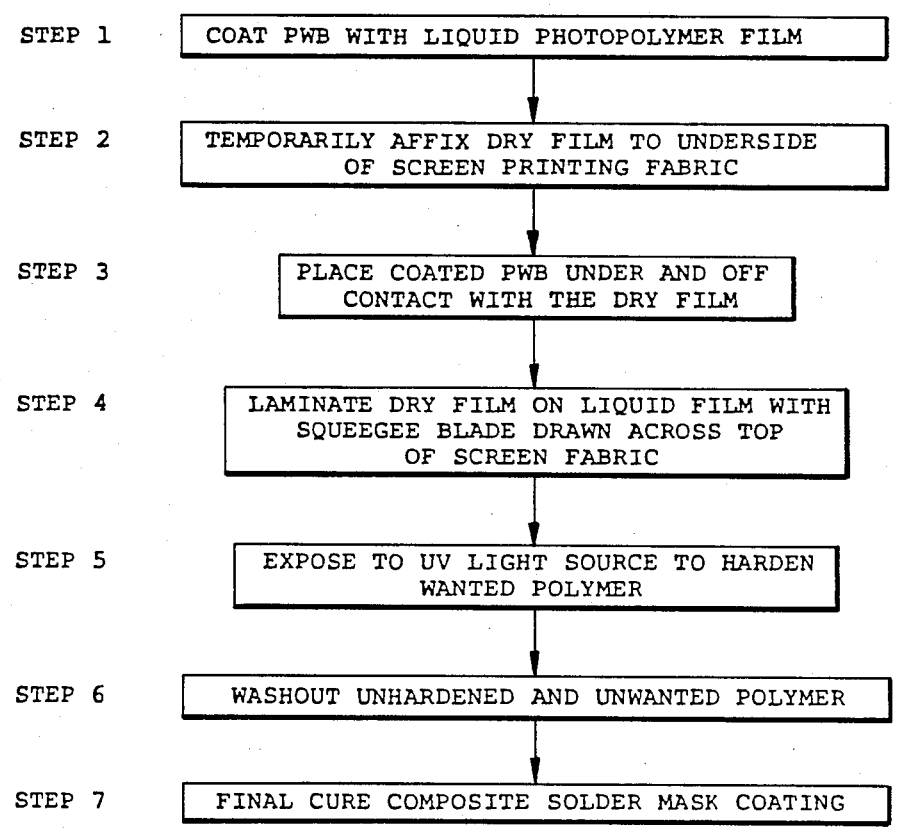
FIG. 2 is a diagram showing the procedure for producing the dry film solder mask - UV-curable solder mask composites of one embodiment of the invention.

Reference is made to FIG. 2, showing the steps to be followed to achieve a composite photoimaged solder mask coating. Step 1 is to coat the PWB having traces 0.004 inch high with a liquid polymer coating 0.001 inch thick. A polyester or nylon screen printing fabric of 125 mesh produces the 0.001 inch coating. The liquid polymer is the W. R. Grace "Unimask 1000" UV-curable solder mask photopolymer which is 100 percent solids and does not outgas during curing.

The dry film solder mask is prepared for laminating to the coated PWB. A section of Dupont "720S Vacrel" dry film with polyolefin liner film is temporarily adhered to the underside of a second screen printing frame having a nylon or polyester fabric of 235 mesh with the polyester carrier film in contact with the screen. The adhesive is the 3M "Spray Mount" adhesive. After adhering, the polyolefin liner film is removed.

Lamination, Step 4, is accomplished by placing the coated PWB under the printing frame with affixed dry film off-contact, then drawing a squeegee blade the length of the PWB across the top side of the fabric. This step forces the dry film into intimate contact with the polymer in such a way that no air is trapped.

Reference is made to FIG. 1, a partial sectional cutaway drawing of the PWB being laminated. PWB 11 with metal conductors 13 rests on surface 12. Screen frame members 10 tension and restrain polyester fabric 18. Dry film photopolymer 14 is shown mated with the PWB behind blade 15 and adhered to screen fabric 18 ahead of the blade. Force 16 causes blade 15 to move downward, forcing photopolymer 14 to contact liquid polymer layer 19. Force 17 causes blade 15 to scan the length of PWB 11. Photopolymer 14 is temporarily adhered to fabric 18 by a light adhesive coating, not shown in FIG. 1.

After lamination, the composite is moved away from fabric 18 and then exposed to a strong UV light source through a photographic film positive, thereby hardening both the outer dry film solder mask and the underlying liquid photopolymer. For example, the Colight "DMVL-HP" exposes the composite in five minutes. After exposure, the uppermost polyester carrier sheet (not shown) is peeled away from the dry film photopolymer. Unhardened photopolymer is washed out in a Dupont "A24" processor using trichlorethane spray for a period of two minutes. Liquid polymer 19 not covered by hardened photopolymer is also washed away by the trichloroethane.

There may be some undercutting of the inner layer photopolymer by the trichloroethane, leaving a slight annular ring around openings in the dry film solder mask where the underlying photopolymer is washed away. This condition is largely eliminated by using the Dupont aqueous dry film solder mask, in which the unexposed photopolymer is washed out in a Dupont proprietary water-based solvent. This solvent does not remove the inner layer. A second washout bath of trichloroethane for 20 seconds serves to washout unwanted inner layer photopolymer cleanly without significant undercutting of the hardened dry film solder mask. This illustrates a significant advantage of the invention which permits two different polymers or two different polymer states, cured and uncured, to be processed independently by selective use of solvents for attaining different results on corresponding layers.

The photoexposure step permits development of the desired patterns by an initial cure changing the state of the polymer. However, particularly for solder mask coatings that need withstand high temperatures, a final hard cure of the composite film is desirable. This is accomplished by exposure to a greater cured radiation such as provided by a strong UV lamp source to fully cure the photopolymer. A conveyorized UV curing unit having two lamps, each rated at 200 watts per linear inch cures the photopolymer at a speed of five feet per minute. Argus International of Hopewell, N. J. manufactures a suitable UV curing unit.

While the aforementioned UV-curable solder mask photopolymer, the "UNIMASK 1000", can be used as the inner layer, the five-minute exposure cycle can be reduced by use of a photopolymer having a higher photospeed. Such a photopolymer can be formulated by combining the following:
CELANESE RADIATION CURABLE RESIN "RR-27418": 100 PARTS
BENZOPHENONE: 3 PARTS
N-METHYLDIETHANOLAMINE: 2 PARTS

EXAMPLE 2

UV-Curable Solder Mask Covering Liquid Photopolymer Inner Layer

When photoimaging a liquid photopolymer, to obtain high resolution, it is preferable to use a phototool contact system, whereby the photopolymer film is pressed into intimate contact with the photopolymer during the exposure cycle. When the paste consistency liquid photopolymer is covering a PWB having a highly irregular surface topology, there is the problem of photopolymer starvation of thin-out over the conductors, for pressure on the phototool forces the photopolymer to extrude sidewards and off the conductors.

Photopolymer starvation in this disclosure is prevented by use of a composite solder mask, wherein the outer layer is formed on the surface of an image-bearing photomask or photographic film positive containing opaque dots on a transparent field for defining solder points. This outer layer is deposited onto the photomask surface to a thickness of 0.001 inch by screen printing. Exposure to a UV light source through the photomask partially hardens the light-struck photopolymer to form the desired pattern. The photomask is then mated with a PWB which has been coated overall with a thin layer of paste consistency solder mask photopolymer, in register, so that the phototool opaque areas are positioned over the PWB circuit conductor pads which are to be free of hardened solder mask. Mating is preferably accomplished by use of a resilient blade to eliminate the need for vacuum chambers. The partially hardened photopolymer does not extrude from the top of the conductors and thus forms a controlled thickness solder mask outer layer. The assembly is exposed to a strong UV light source through the mated photomask, so as to harden both layers of the photopolymer down to the PWB base laminate. The solder mask is completed by removing the phototool and subjecting the PWB to a solvent spray bath to remove unhardened photopolymer and then final curing with a UV curing unit.

It is to be understood that many other advantageous applications are made available by the partially cured through its thickness polymer, thus provided. This technique itself produces a hardened and similar to dry film layer and a liquid layer, so that better adherence over rough surfaces is ensured. Thus a screen formed pattern, partially cured in this way can be adhered to various surfaces directly and then finally cured in-situ to assure a permanent bond and fully cured pattern.

Figure 3:
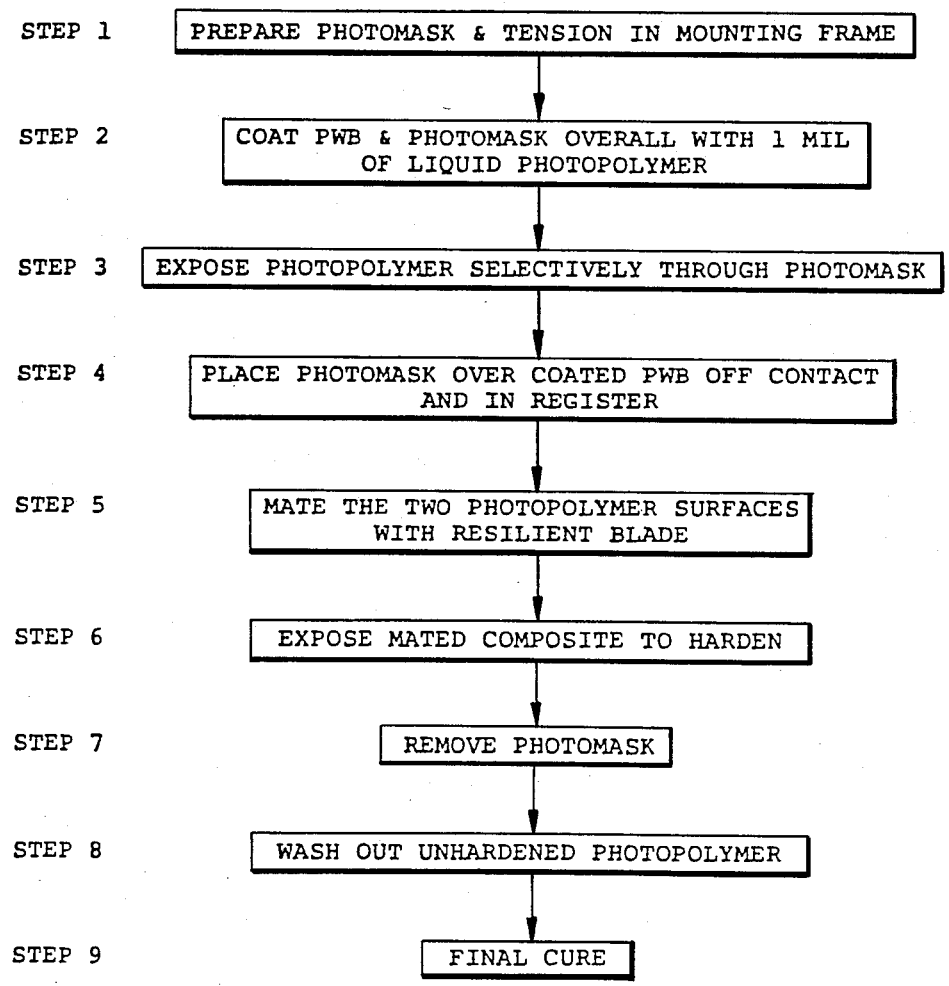
FIG. 3 is a diagram showing the procedure for a further embodiment for producing solder masks with UV-curable photopolymers.

FIG. 3 shows the processing steps to be followed for producing a PWB solder mask coating.

Step 1 is to prepare a special photomask which will have a non-stick release surface coating, and which will withstand the high temperature of the light source, while maintaining dimensional stability. The photomask consists of a clear polyester sheet stretched in a four-sided frame. Photomasks for PWB having higher conductors may be contoured for additional protection against photopolymer starvation over raised surfaces. Contouring is achieved by pressing the phototool onto an uncoated PWB with sufficient force to permanently distort or coin the photomask lower surface to match the contour of PWB surface. Alternatively, contouring can be achieved by molding the thin release coating to the PWB conductor pattern. The opaque areas were previously screen printed onto the polyester sheet.

A thin release coating of Dow Corning "734 RTV" is applied to prevent the photopolymer from sticking. Next, the PWB is coated by screen printing with W. R. Grace "Unimask 1000" photopolymer, using a 125 mesh fabric to deposit a 0.001 inch thickness. The same screen mesh is used to coat the photomask overall with a 0.001 inch thick coating.

Step 3 is to harden the wanted photopolymer on the photomask. A two-minute exposure with the Colight "DMVL-HP" is used.

Steps 4–9 cover the placement of the photomask above and off contact the PWB: mating, reexposure to UV light, solvent washout of unwanted photopolymer, and final cure. These steps are as previously described for the dry film solder mask/liquid photopolymer composite and need not be repeated here.

EXAMPLE 3 Dry Epoxy Solder Mask Photopolymer Outer Layer

A solder mask epoxy photopolymer known as "Probimer 52" is available from CIBA - GEIGY Company of Ardsley, N.Y. This photopolymer is normally applied to the PWB by curtain coating, then oven baked to drive off volatiles until dry, then photoimaged through a photo transparency to further harden wanted photopolymer. Unexposed photopolymer is washed out in a solvent spray bath. This photopolymer is used as the outer layer in the disclosed process in conjunction with the liquid photopolymer inner layer.

The disclosed process includes the coating of a thin transparent plastic sheet having a release surface coating with the "Probimer" liquid and heating until the volatiles are driven off. The resulting dry epoxy photopolymer is processed as described in Example 1 for dry film solder mask. Dupont product "Vacrel 7205". The solvent used to washout the unexposed "Probimer" photopolymer is cyclohexanone.

EXAMPLE 4

Dry Epoxy Solder Mask, Non-Photoimaging

As shown in Table 1, thermal curing epoxies have excellent electrical and environmental characteristics, are low in cost, but exhibit relatively poor printing resolution. The disclosed two-layer solder mask composite using an epoxy outer layer bonded to the PWB by an inner layer of liquid photopolymer retains the primary advantages of the epoxy while improving the printing resolution. First, a thin transparent polyester sheet having a release coating is screen printed with catalyzed "PC-401" epoxy in the correct pattern, which is then cured to the point of being dry but still flexible. To overlaminate the epoxy coating onto the coated PWB, the thin transparent sheet carrying the epoxy is temporarily adhered to the underside of a printing screen and laminated onto the coated PWB, the same way as described in Example 1 for the dry film solder mask, the exception being that the epoxy patterns are properly registered with the PWB circuitry. At this point in the process, the epoxy outer coating covers the PWB overall except for openings to be free of solder mask such as circuit pads, contact fingers, and tooling holes. Circuit pads are covered by the photopolymer liquid.

To bond the epoxy coating to the PWB, the liquid photopolymer inner layer is exposed to a light source through the epoxy coating and through an image-bearing phototransparency. Opaque areas on the phototransparency prevents the photopolymer from being hardened in those PWB areas to be free of all solder mask.

The solder mask is completed by washing out the unexposed photopolymer in trichloroethane and final curing by exposure to a high intensity mercury vapor lamp to cure the photopolymer, and a bake cycle to completely cure the epoxy.

This process improves the solder mask resolution in two ways. First, the epoxy image is printed on a flat surface, wherein the resolution is much improved over printing over the irregular PWB surface. Second, the inner layer is photoimaged, thereby achieving near-exact conformance of solder mask with phototransparency opaque patterns.

Where legends or nomenclaturing is required, the lettering ink is deposited on the carrier sheet first, and the epoxy solder mask patterns overprinted then partially cured, firmly adhering the lettering to the outer solder mask layer. Transfer to the coated PWB is effected as previously described for patterned dry epoxy.

EXAMPLE 5

Non-Photoimaging Epoxy Inner Layer

The superior adhesion of a thermal-curing epoxy is utilized in this process to bond an outer layer of solder mask polymer to PWB. As in Example 4, the desired solder mask pattern is screen printed onto a thin plastic sheet having a non-stick surface coating to a thickness of 0.001 inch. Solder mask epoxy "PC 401" as sold by Nationwide Circuit Products can be used. This epoxy pattern is partially cured by a bake cycle of 250 degrees F for 15 minutes. Next the PWB is coated with a 0.001 inch layer of Epoxy Technology Company "EPO-TEK 730" catalyzed epoxy, which is 100 percent solids and does not outgas while curing.

Preparatory to laminating the two epoxy layers, the plastic sheet carrying the partially cured epoxy pattern is temporarily adhered to the underside of a printing screen, and placed above and off contact the coated PWB, in register. A resilient blade drawn across the top surface of the printing screen laminates the two together without air entrapment. The plastic carrier sheet is peeled away, leaving the two layers joined by epoxy adhesion.

The portions of the inner layer not covered by the outer layer is washed out in a trichloroethane spray, while the wanted portions of the inner layer are protected by the outer layer and are thus shielded from the washout solvent.

Following washout, a bake cycle of 250 degrees F. bonds the two layers with the PWB.

In addition to its use in solder masking as described in the five preceding examples, the disclosed composite coating has been used by the applicant to achieve photoimaged plating resist and etch resist patterns used to define the metal conductor patterns on the PWB base laminate.

The process for achieving a composite plating resist or etch resist coating is as described in Example 2, but substituting the LONDON CHEMICAL COMPANY etch resist 1095 LUV for the UNIMASK 1000 solder mask. In addition to the 1095 LUV, which can be removed from the PWB after etching, the process described in Example 2 can be used to form permanent photopolymer coatings using the PPR 101, a permanent plating resist manufactured by the Haven Corporation of Baltimore, Md.

EXAMPLE 6

Differential Patterns in Laminated Layers

The different polymer layers could include transparent and dyed layers, so that two different patterns may be superimposed. Furthermore, two different dyes in the separate layers may give color effects. The dyes could typically filter out curing radiation in the respective layers. Thus, a layer on the substrate could be first photo exposed through one phototool pattern, and the outer layer later superimposed and photo exposed through a separate phototool pattern. The outer layer then could be removed by a solvent that does not remove the inner layer, etc.

It is to be understood from the foregoing that this invention provides for the contact on a printing surface substrate, such as a PWB, of an active liquid state polymer layer sandwiched between an outer polymer layer and the substrate, which will form a desired printed image pattern in-situ and which will have good adherance qualities over rough substrate surfaces, such as printed wiring patterns. Various preferred embodiments and examples are set forth, advancing the state of the art.

Accordingly, those novel features believed descriptive of the nature and the spirit of the invention are defined with particularity in the following claims.

I claim:

1. The intermediate product in the method of printing on a printed wiring board substrate with a metallic surface, a pattern formed by a thin two layered polymer coating, comprising in combination, a liquid polymer layer of paste-like consistency at least about 0.001 inch thickness for forming a significant part of said pattern sandwiched between an outer polymer layer partially cured with a predetermined pattern for forming a significant part of said pattern and said metallic substrate surface.

2. The combination of claim 1 wherein the outer layer is liquid polymer.

3. The combination of claim 1 wherein the outer layer is a dry epoxy polymer.

4. The combination of claim 1 wherein the inner layer is a photopolymer.

5. The combination of claim 1 wherein the outer layer is a photopolymer.

6. The combination of claim 1 wherein the layers each have a thickness of at least about 0.001 inch.

7. The combination of claim 1 wherein the combined thickness of the two layers is greater than about 0.003 inch.

8. In the method of producing an intermediate product to be used in the method of printing on a printed wiring board substrate having at least in part a metallic clad surface a composite pattern formed by two patterns on respective adjacent polymer coating layers, comprising sandwiching an inner layer of liquid polymer which hardens by radiation being of significant thickness forming one of of said two patterns to reside between an outer polymer layer screen printed in a predetermined pattern shape on a thin plastic sheet for forming the other one of the two patterns and a substrate to which the two patterns are to be bonded, with the liquid layer forming a good bond for producing a desired printed pattern in situ between the outer polymer layer and the substrate surface without entrapping air.

9. The method defined in claim 8 wherein the outer polymer layer comprises a dry epoxy coating formed and dried and carried on said thin plastic sheet, the substrate is coated with a layer of said liquid polymer, and said outer layer is laminated upon said liquid polymer layer.

10. The method defined in claim 8 wherein the substrate printed wiring board has wiring traces thereon having a depth of approximately 0.004 inch, and the two said layers have a thickness of approximately 0.001 inch each.

11. In the method of producing an intermediate product to be used in the method of printing on a substrate a pattern formed by a thin composite two layer polymer coating by formation of the thin coating, comprising the steps of, sandwiching a layer of liquid polymer forming a significant portion of said pattern between an outer polymer layer and a substrate, and forming a good bond between the outer polymer layer and the substrate surface without compromising desired characteristics of the outer layer or entrapping air wherein at least one of the layers has a patterned shape of partially cured polymer before sandwiching that provides the printed pattern shape of that layer.

* * * * *